(12) United States Patent
Cloos et al.

(10) Patent No.: US 10,670,677 B2
(45) Date of Patent: Jun. 2, 2020

(54) MULTI-SLICE ACCELERATION FOR MAGNETIC RESONANCE FINGERPRINTING

(71) Applicants: NEW YORK UNIVERSITY, New York, NY (US); SIEMENS MEDICAL SOLUTIONS USA, INC., Malvern, PA (US)

(72) Inventors: Martijn Anton Hendrik Cloos, New York, NY (US); Tiejun Zhao, New York, NY (US)

(73) Assignees: NEW YORK UNIVERSITY, New York, NY (US); SIEMENS MEDICAL SOLUTIONS USA, INC., Malvern, PA (US)

( * ) Notice: Subject to any disclaimer, the term of this patent is extended or adjusted under 35 U.S.C. 154(b) by 94 days.

(21) Appl. No.: 15/494,410

(22) Filed: Apr. 21, 2017

(65) Prior Publication Data

US 2017/0307706 A1   Oct. 26, 2017

Related U.S. Application Data

(60) Provisional application No. 62/326,128, filed on Apr. 22, 2016.

(51) Int. Cl.
  *G01R 33/48*   (2006.01)
  *G01R 33/483*   (2006.01)
  (Continued)

(52) U.S. Cl.
  CPC ..... *G01R 33/4824* (2013.01); *G01R 33/4835* (2013.01); *G01R 33/50* (2013.01); *G01R 33/5608* (2013.01)

(58) Field of Classification Search
  CPC  G01R 33/4824; G01R 33/4835; G01R 33/50; G01R 33/5608
  See application file for complete search history.

(56) References Cited

U.S. PATENT DOCUMENTS 3,069,654 A   12/1962   Hough
4,532,422 A   7/1985   Nomura et al.
(Continued)

FOREIGN PATENT DOCUMENTS

CA   1159674 A1   1/1984
EP   0 354 37 A1   9/1981
(Continued)

OTHER PUBLICATIONS

Ma et al., "Magnetic resonance fingerprinting", Nature, Mar. 14, 2013, 495:187-193.
(Continued)

*Primary Examiner* — Dixomara Vargas
(74) *Attorney, Agent, or Firm* — Foley & Lardner LLP

(57) ABSTRACT

A method of performing multi-slice acceleration for MR fingerprinting includes obtaining k-space data for MR volumes; applying controlled radio frequency (RF) pulses to the MR volumes; exciting a plurality of slices within the MR volumes by the RF pulses at a same time; and producing a plurality of fingerprints from the plurality of slices. At least one set of fingerprints is compressed, and a residual signal of a plurality of signal evolutions is reduced. The method additionally includes periodically switching a weighting between a first slice and a second slice of the plurality of slices.

20 Claims, 6 Drawing Sheets

(51) Int. Cl.
*G01R 33/50* (2006.01)
*G01R 33/56* (2006.01)

(56) References Cited

U.S. PATENT DOCUMENTS

| | | |
|---|---|---|
| 4,627,729 A | 12/1986 | Breuckmann et al. |
| 4,740,079 A | 4/1988 | Koizumi et al. |
| 4,986,659 A | 1/1991 | Bachalo |
| 4,998,788 A | 3/1991 | Osakabe et al. |
| 5,095,207 A | 3/1992 | Tong |
| 5,796,498 A | 8/1998 | French |
| 5,880,841 A | 3/1999 | Marron et al. |
| 6,097,488 A | 8/2000 | Grek et al. |
| 6,214,560 B1 | 4/2001 | Yguerabide et al. |
| 6,281,994 B1 | 8/2001 | Horikoshi et al. |
| 6,480,285 B1 | 11/2002 | Hill |
| 6,519,033 B1 | 2/2003 | Quist et al. |
| 6,710,874 B2 | 3/2004 | Mavliev |
| 7,001,721 B1 | 2/2006 | Whitcombe et al. |
| 7,218,112 B2 | 5/2007 | Ladebeck et al. |
| 7,248,282 B2 | 7/2007 | Maddison |
| 7,338,168 B2 | 3/2008 | Cartlidge et al. |
| 7,532,327 B2 | 5/2009 | Bloom et al. |
| 7,839,551 B2 | 11/2010 | Lee et al. |
| 8,119,988 B2 | 2/2012 | Daido et al. |
| 8,299,789 B2 * | 10/2012 | Heid ............. A61B 5/055 324/309 |
| 8,331,019 B2 | 12/2012 | Cheong et al. |
| 8,405,395 B2 | 3/2013 | Setsompop et al. |
| 8,431,884 B2 | 4/2013 | Grier |
| 8,680,861 B1 | 3/2014 | Morrone |
| 8,766,169 B2 | 7/2014 | Grier et al. |
| 8,791,985 B2 | 7/2014 | Grier et al. |
| 9,316,578 B2 | 4/2016 | Grier et al. |
| 9,810,894 B2 | 11/2017 | Grier et al. |
| 9,897,675 B2 * | 2/2018 | Setsompop ........ G01R 33/4828 |
| 9,933,351 B2 | 4/2018 | Kent et al. |
| 2002/0069242 A1 | 6/2002 | Berns |
| 2003/0021382 A1 | 1/2003 | Iwanczyk et al. |
| 2004/0004717 A1 | 1/2004 | Reed |
| 2004/0072372 A1 | 4/2004 | Seul et al. |
| 2005/0141757 A1 | 6/2005 | Ayache et al. |
| 2006/0127369 A1 | 6/2006 | Christensen et al. |
| 2007/0070303 A1 | 3/2007 | Yonekubo |
| 2007/0242269 A1 | 10/2007 | Trainer |
| 2008/0037004 A1 | 2/2008 | Shamir et al. |
| 2008/0150532 A1 | 6/2008 | Slavin et al. |
| 2009/0059008 A1 | 3/2009 | Ishii |
| 2009/0128825 A1 | 5/2009 | Akcakir |
| 2010/0090694 A1 * | 4/2010 | Heid ............. A61B 5/055 324/309 |
| 2010/0259263 A1 | 10/2010 | Holland et al. |
| 2011/0130348 A1 | 6/2011 | Ting et al. |
| 2011/0157599 A1 | 6/2011 | Weaver et al. |
| 2012/0177543 A1 | 7/2012 | Battrell et al. |
| 2012/0235678 A1 | 9/2012 | Seiberlich et al. |
| 2012/0256626 A1 | 10/2012 | Adalsteinsson et al. |
| 2013/0038326 A1 | 2/2013 | Amadon et al. |
| 2013/0271135 A1 | 10/2013 | Ozen et al. |
| 2013/0278743 A1 | 10/2013 | Cheong et al. |
| 2013/0308135 A1 | 11/2013 | Dubois et al. |
| 2014/0170735 A1 | 6/2014 | Holmes |
| 2014/0177932 A1 | 6/2014 | Milne et al. |
| 2014/0253126 A1 | 9/2014 | Habara et al. |
| 2015/0002150 A1 | 1/2015 | Weissler et al. |
| 2015/0062587 A1 | 3/2015 | Shpaisman |
| 2015/0300963 A1 * | 10/2015 | Haidekker ........... G01N 33/025 382/131 |
| 2015/0301141 A1 * | 10/2015 | Griswold ........... G01R 33/5608 382/131 |
| 2015/0346300 A1 * | 12/2015 | Setsompop ........ G01R 33/4828 324/309 |
| 2016/0116559 A1 * | 4/2016 | Cohen ................. G01R 33/561 324/309 |
| 2016/0282436 A1 | 9/2016 | Cloos |
| 2016/0291105 A1 | 10/2016 | Knoll et al. |
| 2016/0291107 A1 * | 10/2016 | Rosen ................. G01R 33/543 |
| 2019/0033414 A1 * | 1/2019 | Sofka ................. A61B 5/0042 |
| 2019/0033415 A1 * | 1/2019 | Sofka ................. A61B 5/0042 |

FOREIGN PATENT DOCUMENTS

| | | |
|---|---|---|
| EP | 0 278 714 A2 | 8/1988 |
| EP | 1 855 081 A1 | 11/2007 |
| EP | 1 865 430 A2 | 12/2007 |
| JP | 55-096976 A | 7/1980 |
| JP | 03-251388 A | 11/1991 |
| JP | 03-251888 A | 11/1991 |
| JP | 2000-225302 A | 8/2000 |
| JP | 2001-034148 A | 2/2001 |
| JP | 2007-279475 A | 10/2007 |
| JP | 2011-525967 A | 9/2011 |
| JP | 2014-503794 A | 2/2014 |
| WO | WO-03/048868 A1 | 6/2003 |
| WO | WO-2005/027031 A2 | 3/2005 |
| WO | WO-2006/034129 A2 | 3/2006 |
| WO | WO-2008/127410 A2 | 10/2008 |
| WO | WO-2013/080164 A1 | 6/2013 |
| WO | WO-2015/073894 A2 | 5/2015 |

OTHER PUBLICATIONS

Ye et al., "Accelerating Magnetic Resonance Fingerprinting (MRF) Using t-Blipped Simultaneous Multislice (SMS) Acquisition", Magnetic Resonance in Medicine, 2016, 75(5):2078-2085.

Ben-Eliezer, N., et al., "A new Model-Based Technique for Accurate Reconstruction of T2 Relaxation Maps from Fast Spin-Echo Data", Proc. Intl. Soc. Mag. Reson. Med., 2013, 21:2453.

Chen, Y., et al., "Magnetic resonance fingerprinting (MRF) for rapid quantitative abdominal imaging", Proc. Intl. Soc. Mag. Reson. Med., 2014, 22:0561.

Cloos, M. A., et al., "Plug and Play Parallel Transmission at 7 and 9.4 Tesla based on Principles from MR Fingerprinting", Proc. Intl. Soc. Mag. Reson. Med., 2014, 22:0542.

Doneva, M., et al., "Compressed Sensing Reconstruction for Magnetic Resonance Parameter Mapping", Magnetic Resonance in Medicine, 2010, 64:1114-1120.

Graesslin, I., et al., "Fully Integrated Whole Body 3T MRI System for Parallel RF Transmission", Proc. Intl. Soc. Mag. Reson. Med., May 5, 2007, 15:1007.

Graesslin, I., et al., "Whole Body 3T MRI System with Eight Parallel RF Transmission Channels", Proc. Intl. Soc. Mag. Reson. Med., Apr. 22, 2006, 14:129.

Katscher, U., et al., "RF Encoding Using a Multielement Parallel Transmit System", Magnetic Resonance in Medicine, 2010, 63(6):1463-1470.

Katscher, U., et al., "Parallel RF transmission in MRI", NMR in Biomedicine, Jan. 1, 2006, 19(3):393-400.

Knoll, F., et al., "Simultaneous MR-PET Reconstruction using Multi Sensor Compressed Sensing and Joint Sparsity", Proc. Intl. Soc. Mag. Reson. Med., 2014, 22:0082.

Kosters, T., et al., "EMRECON: An Expectation Maximization Based Image Reconstruction Framework for Emission Tomography Data", 2011 IEEE Nuclear Science Symposium Conference Record, 2011, pp. 4365-4368.

Ma, D., et al., "Magnetic resonance fingerprinting", Nature, Mar. 14, 2013, 495:187-193.

Mueller, S.G., et al., "The Alzheimer's Disease Neuroimaging Initiative", Neuroimaging Clin N Am., Nov. 2005, 15(4):869-877.

Nelles, M., et al., "Dual-Source Parallel RF Transmission for Clinical MR Imaging of the Spine at 3.0 T: Intraindividual Comparison with Conventional Single-Source Transmission", Radiology, Dec. 1, 2010, 257(3):743-753.

Orzada, S., et al., "Design and comparison of two eight-channel transmit/receive radiofrequency arrays for in vivo rodent imaging on a 7 T human whole-body MRI system", Medical Physics, Apr. 27, 2010, 37(5):2225-2232.

Quick, H.H., "Integrated PET/MR", Journal of Magnetic Resonance Imaging, 2014, 39(2):243-258.

(56) References Cited

OTHER PUBLICATIONS

Weber, E., et al., "A Novel 8-Channel Transceive Volume-Array for a 9.4T Animal Scanner", Proc. Intl. Soc. Mag. Reson. Med., Apr. 19, 2008, 16:151.

International Search Report and Written Opinion in PCT/US14/65803, dated Feb. 13, 2015, 8 pages.

Partial supplementary European search report in EP 14861500.8, dated Sep. 5, 2017, 18 pages.

Extended European Search Report in EP 14861500.8, dated Jan. 22, 2018, 17 pages.

U.S. Food and Drug Administration, "Guidance for Industry—Immunogenicity Assessment for Therapeutic Protein Products", Aug. 2014, 39 pages.

Aspnes, D.E., "Local-field effects and effective-medium theory: A microscopic perspective", Am. J. Phys., Aug. 1982, 50(8):704-709.

Atherton, T.J., et al., "Size invariant circle detection", Image and Vision Computing, 1999, 17(11):795-803.

Ball, V., et al., "Complexation Mechanism of Bovine Serum Albumin and Poly(allylamine hydrochloride)", J. Phys. Chem. B, 2002, 106(9):2357-2364.

Ballard, D.H., "Generalizing the Hough Transform to Detect Arbitrary Shapes", Pattern Recognition, 1981, 13(2):111-122.

Basim, G.B., et al., "Effect of Soft Agglomerates on CMP Slurry Performance", Journal of Colloid and Interface Science, 2002, 256(1):137-142.

Basim, G.B., et al., "Effect of Particle Size of Chemical Mechanical Polishing Slurries for Enhanced Polishing with Minimal Defects", Journal of the Electrochemical Society, 2000, 147(9):3523-3528.

Bishop, C.M., "Inverse problems", in Neural Networks for Pattern Recognition, 1995, p. 207, Clarendon Press, Oxford.

Boas, D.A., et al., "Scattering of diffuse photon density waves by spherical inhomogeneities within turbid media: Analytic solution and applications", Proc. Natl. Acad. Sci., May 1994, 91(11):4887-4891.

Bohren, C.F., et al., Absorption and Scattering of Light by Small Particles, 1983, 12 pp., Wiley-VCH Verlag GmbH & Co., KGaA, Weinheim.

Bolognesi, G., et al., "Digital holographic tracking of microprobes for multipoint viscosity measurements", Optics Express, Sep. 26, 2011, 19(20):19245-19254.

Bourquard, a., et al., "A practical inverse-problem approach to digital holographic reconstruction", Optics Express, Feb. 11, 2013, 21(3):3417-3433.

Carpenter, J.F., et al., "Overlooking Subvisible Particles in Therapeutic Protein Products: Gaps That May Compromise Product Quality", Journal of Pharmaceutical Sciences, Apr. 2009, 98(4):12011205.

Chang, C-C., et al., "LIBSVM: A Library for Support Vector Machines", ACM Transactions on Intelligent Systems and Technology, 2011, 2(3), 27 pages.

Chang, C-C., et al., "Training v-Support Vector Regression: Theory and Algorithms", Neural Computation, 2002, 14(8):1959-1977.

Cheong, F.C., et al., "Rotational and translational diffusion of copper oxide nanorods measured with holographic video microscopy", Optics Express, Mar. 29, 2010, 18(7):6555-6562.

Cheong, et al., "Flow visualization and flow cytometry with holographic video microscopy," Optics Express, 2009, 17(15):13071-13079.

Cheong, F.C., et al., "Holographic characterization of individual colloidal spheres' porosities", Soft Matter, 2011, 7(15):6816-6819.

Cheong, F.C., et al., "Holographic microrheology of polysaccharides from *Streptococcus* mutans biofilms", Rheologica Acta, 2009, 48(1):109-115.

Cheong, F.C., et al., "Strategies for three-dimensional particle tracking with holographic video microscopy", Optics Express, 2010, 18(13):13563-13573.

Cheong, F.C., et al., "Technical note: Characterizing individual milk fat globules with holographic video microscopy", J. Dairy Sci., 2009, 92(1):95-99.

Chia, V.K.F., et al., "A Review of Analytical Techniques for Identifying Contaminants in the Semiconductor Industry", Journal of the IEST, 2002, 45(1):37-44.

Colomb, et al., "Polarization microscopy by use of digital holography: application to optical-fiber birefringence measurements," Applied Optics, 2005, 44(21):4461-4469.

Costantino, H.R., et al., "Moisture-Induced Aggregation of Lyophilized Insulin", Pharmaceutical Research, 1994, 11(1):21-29.

Crocker, J.C., et al., "Methods of Digital Video Microscopy for Colloidal Studies", Journal of Colloid and Interface Science, 1996, 179(1):298-310.

Demeule, B., et al., "Characterization of Particles in Protein Solutions: Reaching the Limits of Current Technologies", The AAPS Journal, Dec. 2010, 12(4):708-715.

Den Engelsman, J., et al., "Strategies for the Assessment of Protein Aggregates in Pharmaceutical Biotech Product Development", Pharm Res, 2011, 28(4):920-933.

Denis, et al., "Direct Extraction of the Mean Particle Size from a Digital Hologram," Applied Optics, 2006, 45(5):944-952.

Dixon, L., et al., "Holographic deconvolution microscopy for high-resolution particle tracking", Optics Express, Aug. 15, 2011, 19(17):16410-16417.

Dixon, L., et al., "Holographic particle-streak velocimetry", Optics Express, Feb. 28, 2011, 19(5): 4393-4398.

Dumm, T.F., "Characterization of Low-Level, Oversize Particles in Abrasive Powders," KONA Powder and Particle Journal, 2005, 23:129-138.

Feder, J., et al,. "Scaling Behavior and Cluster Fractal Dimension Determined by Light Scattering from Aggregating Proteins", Physical Review Letters, Oct. 8, 1984, 53(15):1403-1406.

Filipe, V., et al., "Critical Evaluation of Nanoparticle Tracking Analysis (NTA) by NanoSight for the Measurement of Nanoparticles and Protein Aggregates", Pharmaceutical Research, May 2010, 27(5):796-810.

Fung, J., et al., "Holographic measurements of anisotropic three-dimensional diffusion of colloidal clusters", Physical Review E, 2013, 88:020302-1-5.

Fung, J., et al., "Imaging Multiple Colloidal Particles by Fitting Electromagnetic Scattering Solutions to Digital Holograms", Journal of Quantitative Spectroscopy and Radiative Transfer, 2012, 113(18):2482-2489.

Fung, J., et al., "Measuring translational, rotational, and vibrational dynamics in colloids with digital holographic microscopy", Optics Express, Apr. 25, 2011, 19(9):8051-8065.

Goller, M.I., et al., "Inorganic "silicone oil" microgels", Colloids and Surfaces A: Physicochemical and Engineering Aspects, 1997, 123-124:183-193.

Goodman, J.W., "Statistical Properties of Laser Speckle Patterns", in Laser Speckle and Related Phenomena, Topics in Applied Physics, Dainty, J.C., ed., 2007, pp. 9-75, Springer, Berlin, Heidelberg.

Grier, D.G., "A Revolution in Optical Manipulation", Nature, 2003, 424:810-816.

Grier, D., "Downloadable holographic microscopy software written in IDL, the Interactive Data Language", <http://physics.nyu.edu/grierlab/software.html>, 2014, 3 pages.

Hagiwara, T., et al., "Fractal Analysis of Aggregates Formed by Heating Dilute BSA Solutions Using Light Scattering Methods", Biosci. Biotech. Biochem., 1996, 60(11):1757-1763.

Haist, T., et al., "Using Graphics Boards to Compute Holograms", Computing in Science & Engineering, Jan./Feb. 2006, 8:8-13.

Hannel, M., et al., "Holographic characterization of imperfect colloidal spheres", Applied Physics Letters, 2015, 107(14):141905, 4 pages.

Hillman, T.R., et al., "Microscopic particle discrimination using spatially-resolved Fourier-holographic light scattering angular spectroscopy", Optics Express, Nov. 13, 2006, 14(23):11088-11102.

Hogg, R., "Issues in Particle Size Analysis", KONA Powder and Particle Journal, 2008, 26:81-93.

Hollitt, C., "A convolution approach to the circle Hough transform for arbitrary radius", Machine Vision and Applications, 2013, 24(4):683-694.

(56) References Cited

OTHER PUBLICATIONS

Holm, N. K., et al., "Aggregation and fibrillation of bovine serum albumin," Biochimica et Biophysica Acta (BBA)—Proteins and Proteomics, 2007, 1774(9):1128-1138.

Hukkanen, E.J., et al., "Measurement of particle size distribution in suspension polymerization using in situ laser backscattering", Sensors and Actuators B: Chemical, 2003, 96(1-2):451-459.

Ishimaru, A., "Diffusion of light in turbid material", Applied Optics, Jun. 15, 1989, 28(12):2210-2215.

Jones, L.S., et al., "Silicone Oil Induced Aggregation of Proteins", Journal of Pharmaceutical Sciences, Apr. 2005, 94(4):918-927.

Kao, H.P., et al., "Tracking of Single Fluorescent Particles in Three Dimensions: Use of Cylindrical Optics to Encode Particle Position", Biophysical Journal, Sep. 1994, 67(3):1291-1300.

Kolomenkin, M., et al., "Geometric Voting Algorithm for Star Trackers", IEEE Transactions on Aerospace and Electronic Systems, Apr. 2008, 44(2):441-456.

Krishnatreya, B.J., et al., "Fast feature identification for holographic tracking: the orientation alignment transform", Optics Express, Jun. 2, 2014, 22(11):12773-12778.

Krishnatreya, B.J., et al., "Measuring Boltzmann's constant through holographic video microscopy of a single colloidal sphere", American Journal of Physics, 2014, 82:23-31.

Lee, S-H., et al., "Holographic microscopy of holographically trapped three-dimensional structures", Optics Express, Feb. 19, 2007, 15(4):1505-1512.

Lee, S-H., et al., "Characterizing and tracking single colloidal particles with video holographic microscopy", Optics Express, Dec. 24, 2007, 15(26):18275-18282.

Lee, M.H., et al., "Statistics of speckle propagation through the turbulent atmosphere," J. Opt. Soc. Am., Nov. 1976, 66(11):1164-1172.

Malitson, I.H., "Interspecimen Comparison of the Refractive Index of Fused Silica", Journal of the Optical Society of America, 1965, 55(10):1205-1209.

Maret, G., et al., "Multiple Light Scattering from Disordered Media. The Effect of Brownian Motion of Scatterers", Z. Phys. B Condensed Matter, 1987, 65(4):409-413.

Maschke, a., et al., "Micronization of Insulin by High Pressure Homogenization", Pharmaceutical Research, Sep. 2006, 23(9):2220-2229.

Meakin, P., "Fractal Aggregates", Advances in Colloid and Interface Science, 1988, 28:249-331.

Moreno, D., et al., "Particle positioning from charge-coupled device images by the generalized Lorenz-Mie theory and comparison with experiment", Applied Optics, Oct. 1, 2000, 39(28):5117-5124.

Moyses, et al., "Robustness of Lorenz-Mie microscopy against defects in illumination," Optics Express 21(5), pp. 5968-5973 (2013).

Nebrensky, et al., "A Particle Imaging and Analysis System for Underwater Holograms," Optical Methods and Data Processing in Heat and Fluid Flow, pp. 79-92 (2002).

Obey, T.M., et al., "Novel Monodisperse "Silicone Oil"/Water Emulsions", Journal of Colloid and Interface Science, 1994, 163(2):454-463.

Omichi, et al., "Fabrication of enzyme-degradable and size-controlled protein nanowires using single particle nano-fabrication technique," Nature Communications 5, 3718, 8 pages (2014).

Pan, et al., "Three-Dimensional Particle Tracking for Dilute Particle-Liquid Flows in a Pipe," Measurement Science and Technology 13(8), pp. 1206-1216 (2002).

Panchal, et al., "Analyzing Subvisible Particles in Protein Drug Products: a Comparison of Dynamic Light Scattering (DLS) and Resonant Mass Measurement (RMM)," The AAPS Journal 16(3), pp. 440-451 (2014).

Parthasarathy, "Rapid, accurate particle tracking by calculation of radial symmetry centers," Nature Methods 9, pp. 724-726 (2012).

Pawashe & Sitti, "Two-dimensional vision-based autonomous microparticle manipulation using a nanoprobe," Journal of Micromechatronics 3(3-4), pp. 285-306 (2006).

Pedregosa, et al., "Scikit-learn: Machine Learning in Python," Journal of Machine Learning Research 12, pp. 2825-2830 (2011).

Perry, et al., "Real-space studies of the structure and dynamics of self-assembled colloidal clusters," Faraday Discussions 159, pp. 211-234 (2012).

Pine, et al., "Diffusing wave spectroscopy," Physical Review Letters 60(12), pp. 1134-1137 (1988).

Rappaz, et al., "Erythrocytes vol. And refractive index measurement with a digital holographic microscope," Proceedings vol. 6445: Optical Diagnostics and Sensing VII, 644509, 5 pages (2007).

Rappaz, et al., "Simultaneous cell morphometry and refractive index measurement with dual-wavelength digital holographic microscopy and dye-enhanced dispersion of perfusion medium," Optics Letters 33(7), pp. 744-746 (2008).

Remsen, et al., "Analysis of Large Particle Count in Fumed Silica Slurries and Its Correlation with Scratch Defects Generated by CMP," Journal of the Electrochemical Society 153(5), pp. G453-G461 (2006).

Ripple, D.C., et al., "Protein Particles: What We Know and What We Do Not Know", Journal of Pharmaceutical Sciences, 2012, 101(10):3568-3579.

Roichman, et al., "Influence of Nonconservative Optical Forces on the Dynamics of Optically Trapped Colloidal Spheres: the Fountain of Probability," Physical Review Letters 101, 128301, 5 pages (2008).

Rubinstein, et al., "Recognition of distorted patterns by invariance kernels," Pattern Recognition 24(10), pp. 959-967 (1991).

Savin, T., et al., "Role of a finite exposure time on measuring an elastic modulus using microrheology", Physical Review E, 2005, 71:041106, 6 pages.

Savin, T., et al., "Static and Dynamic Errors in Particle Tracking Microrheology", Biophysical Journal, Jan. 2005, 88(1):623-638.

Schellekens, "Bioequivalence and the immunogenicity of biopharmaceuticals," Nature Reviews Drug Discovery 1, pp. 457-462 (2002).

Sciammarella, C.A., et al., "Measuring Mechanical Properties of Materials in the Micron Range", Optical Engineering, May 2003, 42(5), 8 pages.

Seifi, et al., "Fast and accurate 3D object recognition directly from digital holograms," Journal of the Optical Society of America A 30(11), pp. 2216-2224 (2013).

Sheng, et al., "Digital holographic microscope for measuring three-dimensional particle distributions and motions," Applied Optics 45(16), pp. 3893-3901 (2006).

Shpaisman, et al., "Holographic microrefractometer," Applied Physics Letters 101, 091102, 3 pages. (2012).

Singh, et al., "An industry perspective on the monitoring of sub-visible particles as a quality attribute for protein therapeutics," Journal of Pharmaceutical Sciences 99(8), pp. 3302-3321 (2010).

Siposova, et al., "Depolymerization of insulin amyloid fibrils by albumin-modified magnetic fluid," Nanotechnology 23(5), 055101, 10 pages (2012).

Sluzky, et al., "Kinetics of insulin aggregation in aqueous solutions upon agitation in the presence of hydrophobic surfaces," Proceedings of the National Academy of Sciences 88(21), pp. 9377-9381 (1991).

Smola, A.J., et al., "A tutorial on support vector regression", Statistics and Computing, 2004, 14(3): 199-222.

Sorensen, "Light Scattering by Fractal Aggregates: A Review," Aerosol Science and Technology 35(2), pp. 648-687 (2001).

Strzodka, et al., "Real-Time Motion Estimation and Visualization on Graphics Cards," IEEE Visualization 2004, pp. 545-552 (2004).

Tolla, B., et al., "Distortion of Single-Particle Optical Sensing (SPOS) Particle Count by Sub-Countable Particles", Part. Part. Syst. Charact., 2010, 27(1-2):21-31.

Voros, J., "The Density and Refractive Index of Adsorbing Protein Layers," Biophysical Journal, Jul. 2004, 87(1):553-561.

Wang, "Protein aggregation and its inhibition in biopharmaceutics," International Journal of Pharmaceutics 289(1-2), pp. 1-30 (2005).

Wang, et al., "Celebrating Soft Matter's 10th Anniversary: Monitoring colloidal growth with holographic microscopy," Soft Matter 11(6), pp. 1062-1066 (2015).

(56) References Cited

OTHER PUBLICATIONS

Wang, et al., "Holographic characterization of protein aggregates," Journal of Pharmaceutical Sciences 105(3), pp. 1074-1085 (2016).
Wang, et al., "Stimulus-responsive colloidal sensors with fast holographic readout," Applied Physics Letters 107(5), 051903, 5 pages (2015).
Weinbuch, et al., "Micro—Flow Imaging and Resonant Mass Measurement (Archimedes)—Complementary Methods to Quantitatively Differentiate Protein Particles and Silicone Oil Droplets," Journal of Pharmaceutical Sciences 102(7), pp. 2152-2165 (2013).
Witten Jr., T.A., et al., "Diffusion-Limited Aggregation, a Kinetic Critical Phenomenon," Physical Review Letters, Nov. 9, 1981, 47(19):1400-1403.
Wu, S-H., et al., "Synthesis of mesoporous silica nanoparticles," Chem. Soc. Rev., May 7, 2013, 42(9):3862-3875.
Xiao, K., et al., "Multidimensional optical fractionation with holographic verification", Physical Review Letters 104, 2010, 028302, 4 pages.
Yang, et al., "Spatial coherence of forward-scattered light in a turbid medium," Journal of the Optical Society of America A 16(4), pp. 866-871 (1999).
Yevick, et al., "Machine-learning approach to holographic particle characterization," Optics Express 22(22), pp. 26884-26890 (2014).
Yip, et al., "Atomic Force Microscopy of Crystalline Insulins: the Influence of Sequence Variation on Crystallization and Interfacial Structure," Biophysical Journal 74(5), pp. 2199-2209 (1998).
Yip, et al., "Structural and Morphological Characterization of Ultralente Insulin Crystals by Atomic Force Microscopy: Evidence of Hydrophobically Driven Assembly," Biophysical Journal 75(3), pp. 1172-1179 (1998).
Zolls, et al., "How subvisible particles become invisible—relevance of the refractive index for protein particle analysis," Journal of Pharmaceutical Sciences 102(5), pp. 1434-1446 (2013).
International Search Report and Written Opinion for PCT/US2015/060183, dated Feb. 2, 2016, 9 pages.
Extended European Search Report for EP 15858793.1, dated Jul. 11, 2018, 10 pages.

\* cited by examiner

MULTI-SLICE ACCELERATION FOR MAGNETIC RESONANCE FINGERPRINTING

CROSS-REFERENCE TO RELATED APPLICATIONS

This application claims the benefit of U.S. Provisional Application No. 62/326,128 filed on Apr. 22, 2016, which is hereby incorporated by reference in its entirety.

FIELD

The present disclosure generally relates to magnetic resonance fingerprinting techniques.

BACKGROUND

Magnetic resonance fingerprinting (MRF) is an approach to data acquisition, post-acquisition processing, and visualization that permits multiple properties of a tissue or material to be quantified in a non-invasive manner. MRF offers the opportunity to detect and analyze potential indications of physical alterations of tissue or even early indicators of disease.

SUMMARY

Certain embodiments of the present disclosure relate to apparatuses, methods, and computer-readable media with instructions thereon for multi-slice excitation schemes to accelerate MRF data acquisition.

According to an embodiment, a method of performing multi-slice acceleration for MR fingerprinting includes obtaining k-space data for MR volumes; applying controlled radio frequency (RF) pulses to the MR volumes; exciting a plurality of slices within the MR volumes by the RF pulses at a same time; and producing a plurality of fingerprints from the plurality of slices.

According to another embodiment, an apparatus for multi-slice acceleration for MR fingerprinting includes a MR controller configured to receive information from a scanner. The MR controller is configured to obtain k-space data for MR volumes, apply controlled apply controlled radio frequency (RF) pulses to the MR volumes, excite a plurality of slices by the RF pulses at a same time, and produce a plurality of fingerprints from the plurality of slices.

According to a further embodiment, a nontransitory computer-readable memory having instructions thereon includes instructions for obtaining k-space data for MR volumes; applying controlled radio frequency (RF) pulses to the MR volumes; exciting a plurality of slices within the MR volumes by the RF pulses at a same time; and producing a plurality of fingerprints from the plurality of slices.

Additional features, advantages, and embodiments of the present disclosure are apparent from consideration of the following detailed description, drawings, and claims. Moreover, it is to be understood that both the foregoing summary of the present disclosure and the following detailed description are exemplary and intended to provide further explanation without limiting the scope of the present disclosure and the claims.

BRIEF DESCRIPTION OF THE DRAWINGS

The foregoing and other objects, aspects, features, and advantages of the disclosure will become more apparent and better understood by referring to the following description taken in conjunction with the accompanying drawings, in which.

DETAILED DESCRIPTION

Figure 1:
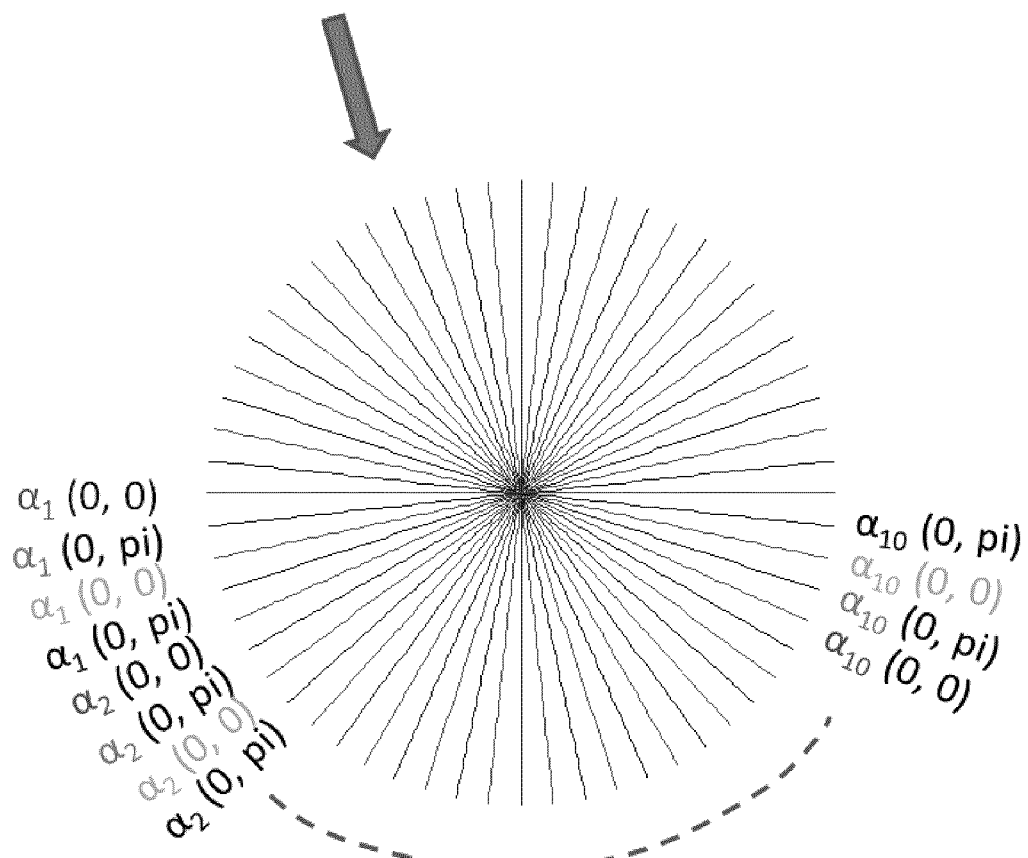
FIG. 1 illustrates a k-space distribution for multi-slice accelerated MRF data acquisition according to an embodiment.

In the following detailed description, reference is made to the accompanying drawings, which form a part hereof. In the drawings, similar symbols typically identify similar elements, unless context dictates otherwise. The illustrative embodiments and/or implementations described in the detailed description, drawings, and claims are not meant to be limiting. Other embodiments and/or implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of ways, all of which are explicitly contemplated and made part of this disclosure.

MRF is a magnetic resonance imaging (MRI) approach that produces multi-parametric maps within a single measurement. These parametric maps may be used to synthesize a multitude of conventional contrast weighted MR images. Further, an MRF signal may serve as a fingerprint to identify pathological conditions.

In general, existing MRF approaches involve a 2D data acquisition scheme in which only one slice is measured at a time, where the slice is the selection of spins in a plane through an object. In 2D data acquisition, with only one slice measured at a time, the total scan time is roughly proportional to the total number of slices in the measurement. Accordingly, for a large number of total slices, the total scan time may be prolonged.

MRF data acquisition time may be reduced according to exemplary embodiments described herein, so as to achieve shorter total scan times than achieved by the 2D data acquisition approaches mentioned above. More particularly, certain exemplary embodiments reduce MRI data acquisition times by exciting multiple slices at the same time and extracting their individual signal contributions by a dedicated MR fingerprint compression technique. Thus, the coverage per unit time is extended, and the total measurement time within a given slice coverage is reduced.

Various MR schemes include modified EPI pulse sequences in which a series of magnetic gradient field 'blips' are applied along a slice-encoding direction. Ye et al., "Accelerating magnetic resonance fingerprinting (MRF) using t-blipped simultaneous multislice (SMS) acquisition," *Magn. Reson. Med.* 2015 Jun. 8. doi: 10.1002/mrm.25799, proposes a multi-slice acceleration (MSA) for MRF based on a t-blipped multi-slice scheme, where the t-blip corresponds to a duration of a gradient blip along a given dimension. In Ye, a $G_z$ blip is added before each data acquisition window and is balanced with a $G_z$ blip of opposing polarity at the end of each repetition time. Different signal phases may be encoded into each slice without major disturbances to the MR fingerprint.

In contrast to Ye, the multi-slice acquisition techniques of various embodiments involve applying controlled radio frequency (RF) pulses. Phase encoding using RF pulses is particularly beneficial for thick slices to avoid problems from non-linear gradients and dephasing effects through slices. Applying controlled RF pulses results in shorter total scan times than MRF techniques employing gradient blips. Further, applying controlled RF pulses contributes to improved signal to noise ratios for thick slices, e.g., slices greater than 3 mm in thickness. Additionally, more precise control over the RF phase may be realized.

Further, the multi-slice acquisition techniques of embodiments described herein involve RF-based phase encoding with MRF fingerprints tailored to each slice of a plurality of slices. Considerations relevant to radial MRF include the preservation of a proper phase relation inside an RF train, as well as selection of a suitable compression technique. Appropriate compression techniques may include those described in PCT/US2014/065803 and U.S. Patent Application Ser. No. 61/904,716, for example, or singular value decomposition compression as developed by the Case Western Reserve University. Other compression techniques may also be implemented.

The embodiments herein achieve a fixed phase relation between subsequent excitation pulses, which is important in order to preserve coherence pathways. Without the proper phase relation, the buildup of coherence pathways needed to measure transverse relaxation ($T_2$) may collapse. Such uncontrolled phase evolutions create different MRF fingerprints for different slices, each with a different sensitivity to $T_2$ variations. For example, the MRF fingerprints are sensitive to inevitable decreases in $T_2$. Observed $T_2$ may generally decrease to reach a lowest value in a pre-simulated fingerprint dictionary (e.g., a dictionary of reference data provided in a database. Further, as noted above, coherence pathways may be destroyed; however, even if the coherence pathways are not completely destroyed, they have residual contributions which resemble noise-like elements in the MR fingerprint.

FIG. 1 illustrates a k-space distribution for multi-slice accelerated MRF data acquisition according to an embodiment. The MRF data acquisition includes a train of n RF pulses, which may be repeated multiple times. For example, the MRF data acquisition may include RF pulses repeated as described in Cloos, Self calibrating parallel transmission by spin dynamic fingerprinting, PCT/US2014/065803, filed Nov. 14, 2014 and claiming priority to U.S. Ser. No. 61/904,716, filed Nov. 15, 2013, both of which are incorporated by reference in their entireties for the technical descriptions and concepts described therein. The k-space data (corresponding to the frequency domain representation of an image) may be acquired for magnetic resonant volumes (for instance, the volume of an object, e.g., in a human or animal body, to which energy is applied) according to techniques described by Cloos and in U.S. patent application Ser. No. 15/051,450 to Knoll et al., filed on Feb. 23, 2016, for example. As indicated in FIG. 1, the phase between neighboring k-space lines is altered such that the signal from all but one slice remains. The signal from other slices may interfere destructively and add noise.

As shown in FIG. 1, a train is formed by a plurality of pulses, each of which may have a different excitation flip angle $\alpha_i$. Within a given set of the RF pulses (e.g., 10 sets in FIG. 1), the phase relation between the excitation and readout is maintained so as to be constant. However, the angle of the readout is changed from one to the next. For example, the angle may change in increments of 2°, 5°, 10°, etc. Alternatively, the angle may be set to the golden angle. By keeping a constant phase relation between the excitation and the readout, while varying the angle of the readout, the generated data points may be aggregated into one radial data set. The single aggregated radial data set may then be reconstructed using a non-uniform Fourier transform, for example.

To obtain a larger number of radial lines per data set, an excitation train may be repeated using different readout angles according to MR fingerprint compression techniques as described in PCT/US2014/065803 and U.S. Patent Application No. 61/904,716; U.S. Patent Application Nos. 62/120,322 filed Feb. 24, 2015 and 62/120,667 filed Feb. 25, 2015, directed to PET-MR imaging using multi parametric MR data acquisition and multi modality joint image reconstruction, and U.S. patent application Ser. No. 15/051,450 to Knoll et al, filed on Feb. 23, 2016, all of which are incorporated by reference in their entireties for the technical descriptions and concepts described therein.

In the embodiment shown in FIG. 1, a two-fold slice acceleration factor is used. The multi-slice RF pulses excite two slices with a different relative phase. Both slices will either have the same phase [0, 0] (as indicated by the lines labeled 'b' in FIG. 1) or opposite phase [0, π] (as indicated by the lines labeled 'a' in FIG. 1). During each RF pulse train, the phase relation between the slices remains fixed, i.e., the phase relation remains either (0, 0) or (0, π). However, when the RF train is repeated, a different phase relation may be used. Further, while a slice acceleration factor of two is used above, slice acceleration may be extended to higher factors, e.g., a factor of four, a factor of six, a factor of eight, etc.

Referring again to FIG. 1, each radial line is bordered by neighboring lines of opposite phase. That is, the neighboring radial lines, after compression, alternate between the phase relations [0, 0] and [0, π]. Thus, signals from the second slice are cancelled out almost completely, so as to be negligible. By way of example, in FIG. 1, the relative phase of a first slice is zero among the radial lines. In contrast, the relative phase between the excitation and readout alternates between zero and π for a second slice. Accordingly, an image reconstructed from a normal radial image reconstruction (e.g., after re-gridding or after using a non-uniform Fourier transform) contains the image of the first slice, in addition to a pseudo noise-like background from the second slice. Negating every other line before starting image reconstruction reveals the image of the second slice with a pseudo noise-like background from the first slice superimposed thereon.

Figure 5:
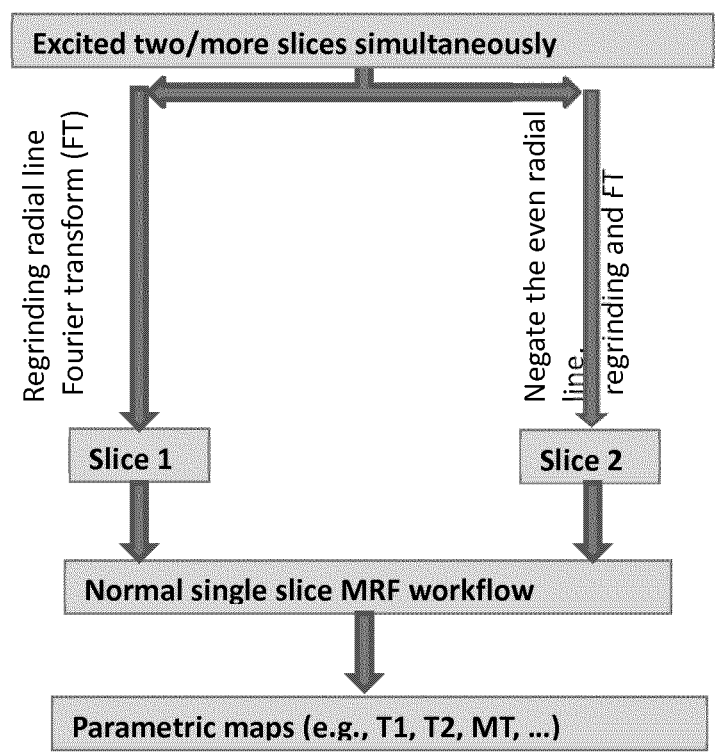
FIG. 5 illustrates a multi-slice acceleration MRF technique according to an embodiment.

Turning now to FIG. 5, a technique involving multi-slice acceleration is shown for two slices, e.g., for a first slice x1 and a second slice x2. In particular, the slices x1, 2 are excited simultaneously. The acquired radial line for simultaneously acquired slices may be reconstructed via adding different phases to a given radial line to obtain individual images. A regridding of the radial lines or application of a Fourier transform is performed for the first slice x1. For the second slice x2, the even radial line is negated, while regridding and the Fourier Transform are performed. Once the images are generated, each separated image can be fed to a normal MRF framework to extract parametric maps (e.g., T1, T2, MT, and so forth) for each slice. The duly processed slice information is then treated as if it had originated from a normal single slice rather than from a multi-slice excitation process.

During a MRF measurement, the RF train is repeated only a few times, e.g., 2-8 times. Without fingerprint compression, a typical measurement containing 4 repetitions would provide only 4 radial lines for each data set. Thus, a high undersampling factor is present. With such a high undersampling factor, a residual signal produced by the alternating phases is too large and contains excessive structure, leading to significant image artifacts. However, by providing an increased number of radial lines after compression, the cancelation effects from the alternating phases greatly improve the overall signal output. More particularly, the cancellation effects serve to reduce the amplitude and structure of the residual signal amplitude from an unwanted slice to noise.

Referring again to FIG. 1, ten successive time points from the MR fingerprint were compressed into one data set. The RF train was repeated 4 times, each with different radial angles (indicated by $\alpha_1, \alpha_2, \ldots \alpha_{10}$ as labeled 'W,' 'X,' 'Y,' and 'Z' in FIG. 1). After compression, the neighboring radial lines alternate in phase between $(0, 0)$ and $(0, \pi)$ to maximize signal cancelation from one or the other slice during reconstruction. As mentioned above, the phase of the first slice is kept constant (zero) for all radial lines, whereas the phase of the second slice alternates between 0 and $\pi$ along the radial lines.

As shown in FIG. 1, the distribution of radial lines after compression is substantially uniform. To obtain such a uniform distribution of radial lines while alternating phase relations, a predefined lookup table or a parametric equation such as Eq. 1 may be used.

$$\phi \text{ (shot, index)} = \delta\phi \text{ Mod [shot, } N\text{Shots}/MB] + \qquad \text{Eq. 1}$$
$$\delta\ MB * \text{Floor [shot} * MB/N\text{Shots]} + \delta\omega \text{ index}$$

In Eq. 1 above, a shot is a current repetition of the RF train, and the index corresponds to the current pulse in the RF train. Further, NShots is the total number of times the RF train is repeated, a compression factor is the number of time points compressed into one data point, and MB is the number of simultaneously excited slices. The following relationships are established:

$\delta\phi = 180\ MB/N\text{Shots}$ $\delta\omega = \delta\phi/\text{Compression Factor}$ $\delta M = \delta\omega/MB$ Referring yet again to FIG. 1, the radial lines depicted therein are uniformly distributed, as mentioned above. However, in certain alternative embodiments, the distribution may be non-uniform. A nearly uniform distribution, such as a radial line distribution created by the golden angle, may be employed. A nearly uniform distribution may suitable provided that, on average, the neighboring radial lines have alternating phases. For a slice acceleration factor exceeding two, the phases of canceled slices for neighboring slices should be incremented through $0, 2*\pi/MB, 2*\pi*2/MB$, etc., where the MB is the slice acceleration factor. Uniform or nearly uniform distribution of radial lines, including bisection method for radial imaging, may be used.

Figure 2:
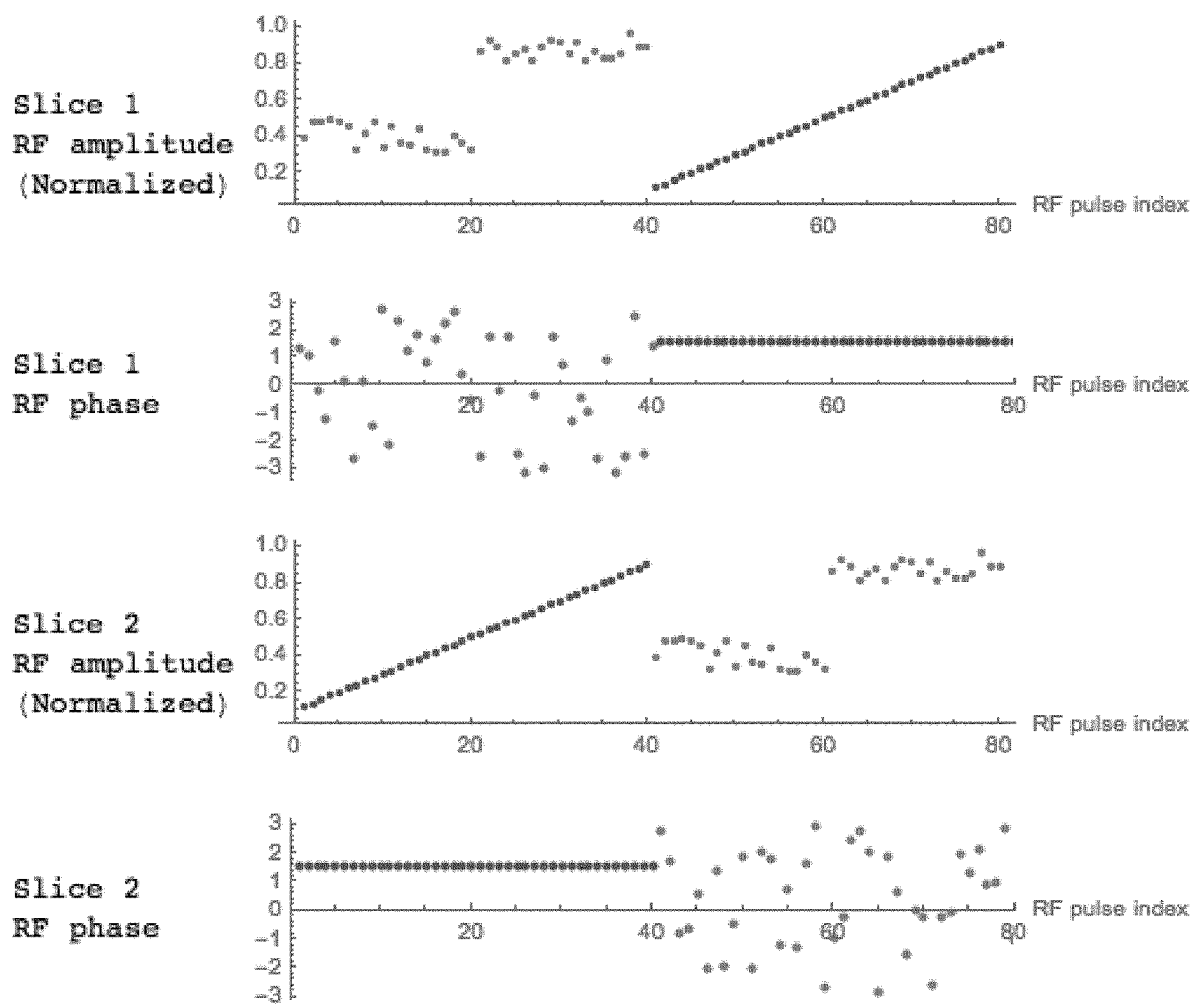
FIG. 2 illustrates an embodiment of a RF pulse train for an embodiment which produces distinct fingerprints for each of two simultaneously excited slices.

Turning now to FIG. 2, an example of a multi-slice acceleration RF pulse train is shown. FIG. 2 contains four plots that illustrate amplitude and phase of the RF pulse that interacts with spins in each slice. In FIG. 2, the top two plots correspond to the first slice, and the bottom two plots to the other slice. Specifically, for each of the first and second slice, the normalized RF amplitude and RF phase are plotted relative to the RF pulse index. In various embodiments, the multi-slice excitation pulses are determined such that a signal from each slice produces a distinct fingerprint. In FIG. 2, the orthogonality between fingerprints is controlled. In particular, the relationship between fingerprints produced by spins excited in each slice is controlled. A finite number of MR fingerprints may be generated by a given RF train, and different RF trains may be established to produce sets of possible fingerprints having a minimal overlap. Thus, a multi-slice RF train may be established which excites multiple slices at the same time, while creating fundamentally different fingerprints for each slice. As each fingerprint is distinctive, the ease with which an origin (i.e., a slice) of the signal may be identified is increased.

To produce distinct fingerprints, different flip angles and RF phases may be produced for each slice, as per Eq. 2 (including different flip angles $\alpha$ and $\beta$).

$$\text{Slice 1:} \alpha_1, \alpha_2, \alpha_3, \ldots, \alpha_n \qquad \text{Eq. 2}$$

$$\text{Slice 2:} \beta_1, \beta_2, \beta_3, \ldots, \beta_n$$

In the embodiment shown in FIG. 2, the RF pulse train is used to produce distinct fingerprints per slice. In particular, the first 40 RF pulses produce an RF spoiled signal evolution in which traverse coherences are disrupted (illustrated by the points labeled 'a'), while the RF phase is maintained so as to be constant on the second slice (illustrated by the points labeled 'b'). In this manner, a T1 weighted signal is obtained from the first slice while a T1/T2 weighted signal is produced by the second slice. As indicated by the distribution of the second 40 time points, a signal weighting obtained from each slice may be switched by keeping the relative phase constant for one of the slices (e.g., the first slice), and introducing RF spoiling on the other of the slices.

Referring again to FIG. 2, this embodiment differs from that shown in FIG. 1 with respect to flip angles, for example. In FIG. 1, $\alpha_i = \beta_i$, whereas in FIG. 2, the angles may differ, so different RF trains are produced for each slice. The multi-slice accelerated MR fingerprinting pulse sequence of FIG. 2 permits each slice to produce fundamentally different signal evolutions. Having different signal evolutions for different slices enhances robustness, and leaves reduced, noise-like residual signal contributions from the suppressed slice.

Referring once more to FIG. 2, a small flip angle gradient and an RF spoiled train of excitations may be provided for a first slice (shown by the points marked 'a'), while larger flip angles without RF spoiling may be provided for the second slice (shown by the points marked 'b'). Accordingly, as mentioned above the signal from the first slice produces a T1 weighted signal response, whereas the second slice produces a T2/T1 weighted signal evolution. Periodically switching the weighting between the first and second slices ensures a similar sensitivity to T1 and T2 for each slice. Additionally, periodic switching produces distinct fingerprints, as shown in FIG. 2. As with the embodiment in FIG. 1, each repetition of the RF train may be provided with a different relation between the RF phase and readout phase, e.g., to suppress the first slice or the second slice. The pre-simulated fingerprint dictionary (e.g., a dictionary of reference data provided in a database) may be used to extract multi-parametric maps corresponding to each slice.

Figure 3:
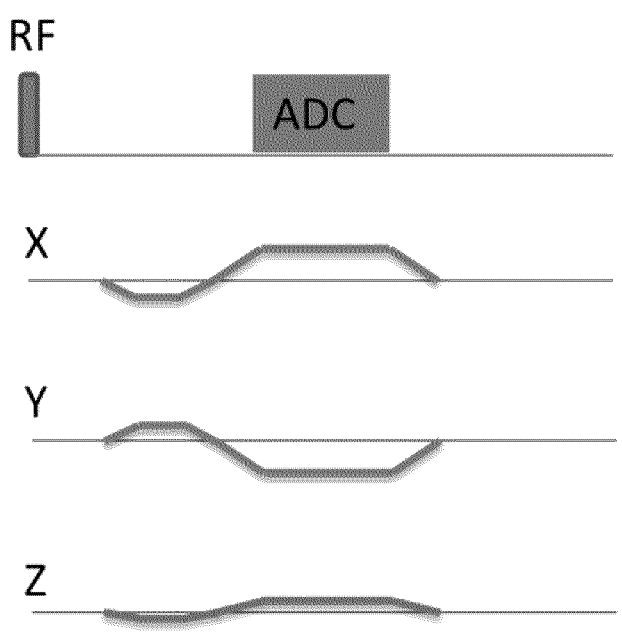
FIG. 3 illustrates a sequence block including a radial readout with gradient based multi-slice encoding, according to an embodiment.

Turning now to FIG. 3, a technique for further reducing pseudo noise is depicted. As described above, the embodiments depicted in FIGS. 1 and 2 reduce the residual signal to a noise-like contribution. In certain embodiments, the pseudo noise may be randomized. In particular, the residual noise may be randomized by shifting the image from the second slice with respect to the first slice in a pseudo-random fashion. To shift the image of the second slice with respect to the first slice, a linear phase is added to the second slice. The linear phase may be added by using a z-gradient during the 2D data acquisition.

Referring again to FIG. 3, a radial readout is depicted, including a z-gradient added to create the desired phase change. Specifically, FIG. 3 depicts x, y and z gradient measurements of the apparent diffusion coefficient readout. In addition to the normal radial readout gradients along x, y, the small z-gradient (shown as the bottommost line in FIG. 3) may be applied to form the desired linear phase change for a given radial line. To reduce dephasing and thereby mitigate blurring effects from the applied z-gradient, the z-gradient is far smaller than the x, y gradients. For instance, the image of the second slice is shifted relative to the first slice by 1 pixel. In some embodiments, the image of the second slice may be shifted relative to the first slice by 2, 3, 4, 5, 6, 7 or 8 pixels, for example.

Still in reference to FIG. 3, in the MRF train, a set number of images is obtained for the first and second slices following compression. Further, a process to randomize pseudo-noise is carried out. The pseudo noise originates residual coherences in undesired signal contributions, i.e., coherence artifacts produced by undesired slices. To randomize the pseudo-noise (as may also be referred to herein as a residual noise) added from the second slice by adding a linear phase, as described above, the image of the second slice is shifted by one or several pixels (e.g., between 1-8 pixels) in different directions. Randomization may be performed, for example, by using a look-up table containing randomized values. Further, a random number generator may be employed. For example, a random number generator may be used in conjunction with a microcomputer or microprocessor containing a storage unit having a memory to record shifts in pixels along with measured data to permit reconstruction.

Figure 4:
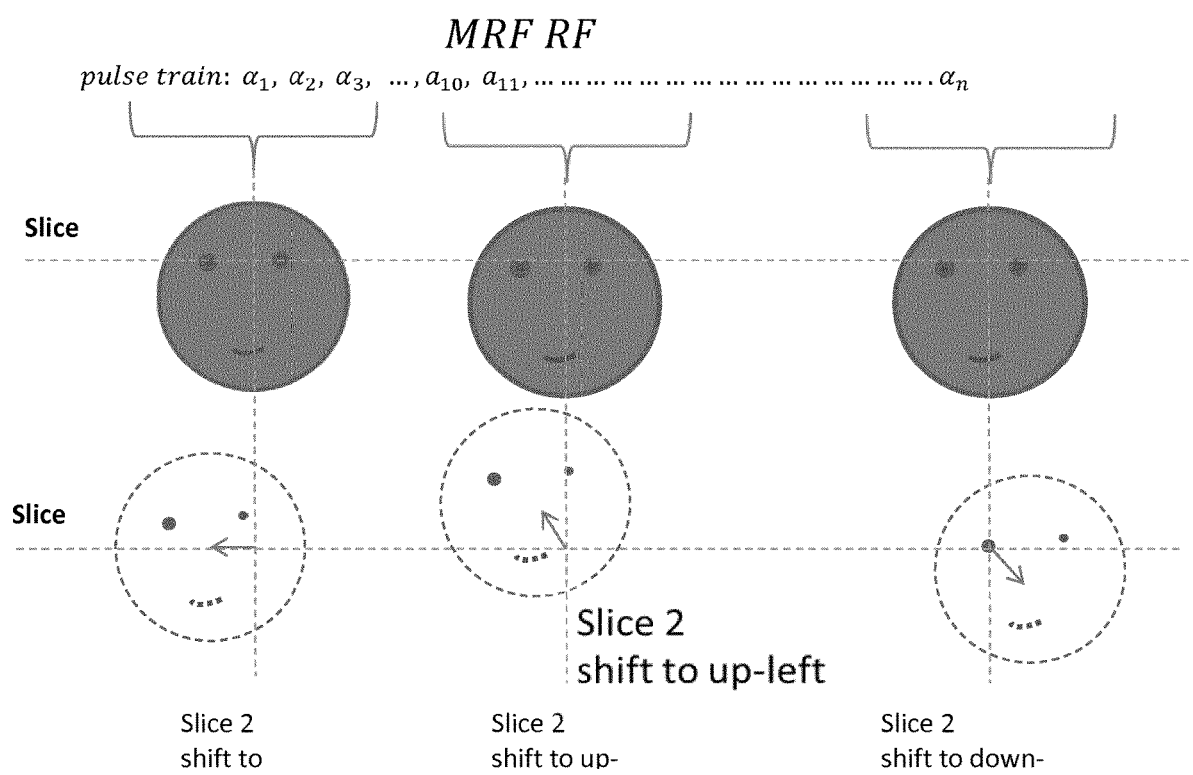
FIG. 4 illustrates a pseudo-noise suppression technique according to an embodiment.
Figure 6:
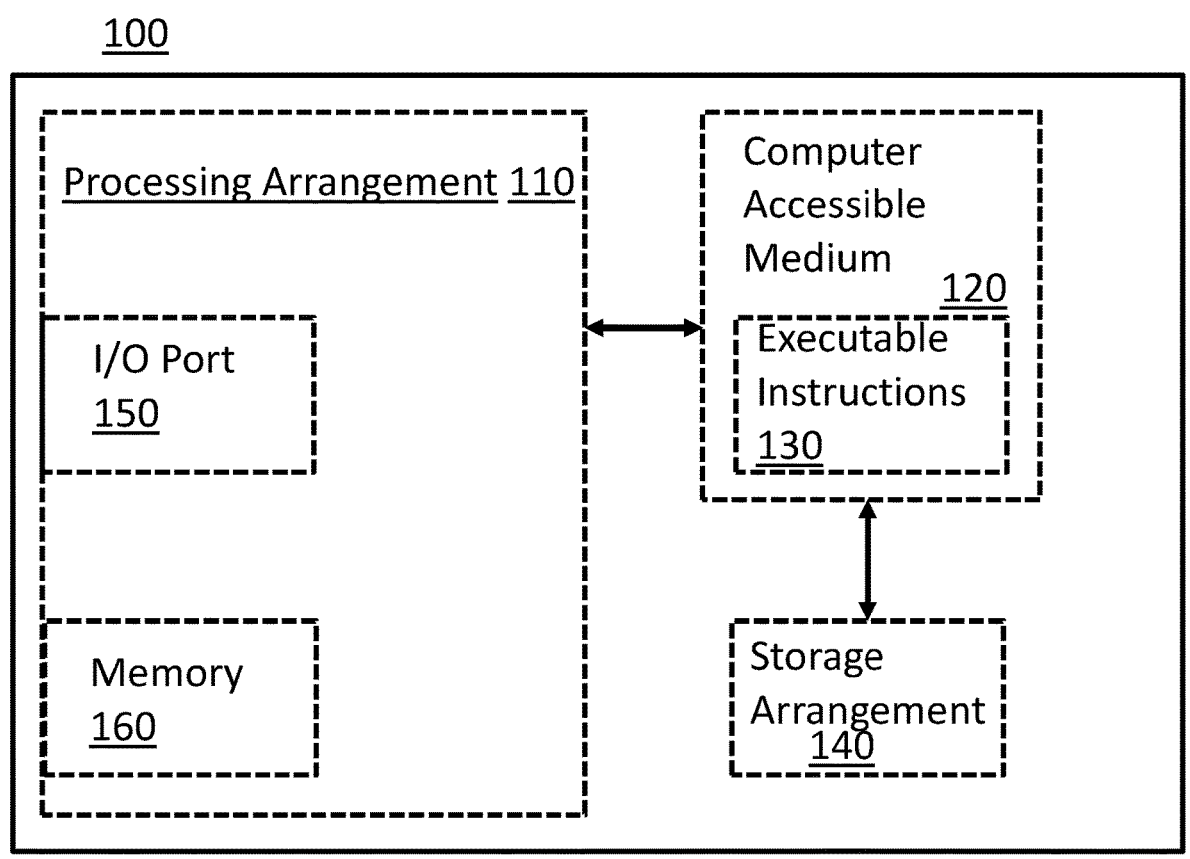
FIG. 6 illustrates a computer system for multi-slice acceleration for MRF according to an embodiment.

FIG. 4 depicts a technique for suppression of pseudo noise structures by circular shifting. Namely, FIG. 4 depicts noise suppression in which the image of the second slice is shifted relative to the first slice. Relative to the first slice, the second slice may be shifted to the left, or upwards and to the left, or downwards and to the right, for example. For example, the images of the second slice may be shifted along a circle defined by $rxe^{i\theta}$, where r corresponds to the number of pixels to be shifted, and $\theta$ equals $2*\pi/N$, where N is the total number of MRF time points after compression for a given slice. In this manner, residual structures in the noise-like contributions from the second slice are shifted to different locations. Consequently, these residual signal contributions are less coherent and have less of an impact on the measurement One embodiment relates to a system for multi-slice acceleration for magnetic resonance fingerprinting comprising a processor and a tangible computer-readable medium operatively connected to the processor. As shown in FIG. 6, e.g., a computer-accessible medium 120 (e.g., as described herein, a storage device such as a hard disk, floppy disk, memory stick, CD-ROM, RAM, ROM, etc., or a collection thereof) can be provided (e.g., in communication with the processing arrangement 110).

The computer-accessible medium 120 may be a non-transitory computer-accessible medium that is part of a control unit or controller. For example, the computer-accessible medium 120 may be part of a controller provided in a clinical setting which is in communication with at least one imaging device, such as a PET-MR scanner from which the controller is configured to receive information, for example. The computer-accessible medium 120 can contain executable instructions 130 thereon. In addition or alternatively, a storage arrangement 140 can be provided separately from the computer-accessible medium 120, which can provide the instructions to the processing arrangement 110 so as to configure the processing arrangement to execute certain exemplary procedures, processes and methods, as described herein, for example.

The instructions may include multiple of sets of instructions. For example, in some embodiments, instructions are provided for acquiring k-space data, obtaining fingerprints, compressing fingerprints, and analyzing output data. In some embodiments, certain instructions may not be provided.

System 100 may also include a display or output device, an input device such as a keyboard, mouse, touch screen or other input device, and may be connected to additional systems via a logical network. Many of the embodiments described herein may be practiced in a networked environment using logical connections to one or more remote computers having processors. Logical connections may include a local area network (LAN) and a wide area network (WAN). Such networking environments are commonplace in office-wide or enterprise-wide computer networks, intranets and the Internet and may use a wide variety of different communication protocols. Those skilled in the art can appreciate that such network computing environments can typically encompass many types of computer system configurations, including personal computers, hand-held devices, multi-processor systems, microprocessor-based or programmable consumer electronics, network PCs, and the like. Various embodiments may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

Various embodiments are described in the general context of methods, which may be implemented in one embodiment by a program product including computer-executable instructions, such as program code, executed by computers in networked environments. Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web embodiments may be realized with programming techniques including rule based logic and other logic to accomplish the various acquisition, analysis and compression steps, for example. It should also be noted that the words "component" and "module," as used herein and in the claims, are intended to encompass embodiments using one or more lines of software code, and/or hardware embodiments, and/or equipment for receiving manual inputs.

Certain embodiments described above achieve various advantages, including substantially reduced acquisition times, as noted above. The techniques described herein may be applied to a wide range of MRF applications so as to further accelerate acquisition times, to obtain higher resolution images without prolonging acquisition times, and/or to have an extended field of view. Such techniques may lower overall costs and enhance patient comfort by reducing the total time when the patient is in the scanner, which may be a time of anxiety and some discomfort for certain patients.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

The foregoing description of illustrative embodiments or implementations has been presented for purposes of illustration and of description. It is not intended to be exhaustive or limiting with respect to the precise form disclosed, and modifications and variations are possible in light of the above teachings or may be acquired from practice of the disclosed embodiments. Therefore, the above embodiments should not be taken as limiting the scope of the invention.

What is claimed is:

1. A method of performing multi-slice acceleration for MR fingerprinting, comprising:
    obtaining k-space data for MR volumes;
    applying controlled radio frequency (RF) pulses to the MR volumes;
    exciting a plurality of slices within the MR volumes by the RF pulses at a same time; and
    producing a plurality of fingerprints from the plurality of slices;
    generating images from a first slice and a second slice of the plurality of slices; and
    shifting images of the second slice along a circle defined by $r \times e^{i\theta}$ where r is a number of pixels to be shifted, and $\theta$ equals $2*\pi/N$, where N is a total number of MR fingerprint time points after compression for the second slice.

2. The method of claim 1, further comprising:
    compressing at least one set of fingerprints of the plurality of fingerprints.

3. The method of claim 1, further comprising:
    reducing a residual signal of a plurality of signal evolutions.

4. The method of claim 1, further comprising:
    producing a plurality of MR fingerprints for each slice of the plurality of slices.

5. The method of claim 1, further comprising:
    periodically switching a weighting between a first slice and a second slice of the plurality of slices.

6. The method of claim 1, wherein a phase relation is constant between subsequent RF pulses.

7. The method of claim 1, wherein more than two slices of the plurality of slices are excited at the same time.

8. The method of claim 1, wherein:
    the plurality of slices comprises a first slice and a second slice, and
    a relative phase of the first slice is zero and a relative phase of the second slice alternate between 0 and $\pi$.

9. The method of claim 1, further comprising:
    compressing a plurality of measurements from at least one fingerprint of the plurality of fingerprints into one data set;
    wherein the RF pulses are applied for a plurality of repetition at different radial angles, and
    wherein, following compression, a plurality of radial line readouts alternate in phase.

10. The method of claim 9, wherein the radial lines alternate between (0, 0) and (0, $\pi$).

11. An apparatus for multi-slice acceleration for MR fingerprinting, comprising:
    a MR controller configured to receive information from a scanner, the MR controller configured to:
    obtain k-space data for MR volumes;
    apply controlled radio frequency (RF) pulses to the MR volumes;
    excite a plurality of slices by the RF pulses at a same time; and
    produce a plurality of fingerprints from the plurality of slices;
    wherein the plurality of slices comprises a first slice and a second slice, and a relative phase of the first slice is zero, and a relative phase of the second slice alternates between 0 and $\pi$.

12. The apparatus of claim 11, wherein the controller is configured to:
    compress at least one set of fingerprints of the plurality of fingerprints.

13. The apparatus of claim 11, wherein the controller is configured to:
    reduce a residual signal of a plurality of signal evolutions.

14. The apparatus of claim 11, wherein the controller is configured to:
    produce a plurality of MR fingerprints for each slice of the plurality of slices.

15. The apparatus of claim 11, wherein the controller is configured to:
    periodically switch a weighting between a first slice and a second slice of the plurality of slices.

16. The apparatus of claim 11, wherein a phase relation is constant between subsequent RF pulses.

17. A nontransitory computer-readable memory having instructions thereon, the instructions comprising:
    instructions for obtaining k-space data for MR volumes;
    applying controlled radio frequency (RF) pulses to the MR volumes;
    exciting a plurality of slices within the MR volumes by the RF pulses at a same time; and
    producing a plurality of fingerprints from the plurality of slices;
    wherein the plurality of slices comprises a first slice and a second slice, and
    a relative phase of the first slice is zero and a relative phase of the second slice alternate between 0 and $\pi$.

18. The nontransitory computer-readable memory of claim 17, the instructions further comprising:
    Instructions for generating images from a first slice and a second slice of the plurality of slices; and
    instructions for shifting images of the second slice along a circle defined by $r \times e^{i\theta}$ where r is a number of pixels to be shifted, and $\theta$ equals $2*\pi/N$, where N is a total number of MR fingerprint time points after compression for the second slice.

19. A method of performing multi-slice acceleration for MR fingerprinting, comprising:
- obtaining k-space data for MR volumes;
- applying controlled radio frequency (RF) pulses to the MR volumes;
- exciting a plurality of slices within the MR volumes by the RF pulses at a same time; and
- producing a plurality of fingerprints from the plurality of slices;
- wherein the plurality of slices comprises a first slice and a second slice, and a relative phase of the first slice is zero, and a relative phase of the second slice alternates between 0 and $\pi$.

20. The method of claim 19, further comprising:
- compressing a plurality of measurements from at least one fingerprint of the plurality of fingerprints into one data set;
- wherein the RF pulses are applied for a plurality of repetition at different radial angles, and
- wherein, following compression, a plurality of radial line readouts alternate in phase.

* * * * *